(12) United States Patent
Chien

(10) Patent No.: US 10,571,494 B2
(45) Date of Patent: Feb. 25, 2020

(54) ELECTRIC POWER MEASURING DEVICE

(71) Applicant: Shih Hsiang Chien, Changhua Hsien (TW)

(72) Inventor: Shih Hsiang Chien, Changhua Hsien (TW)

(73) Assignee: PEACEFUL THRIVING ENTERPRISE CO., LTD., Changhua Hsien (TW)

( * ) Notice: Subject to any disclaimer, the term of this patent is extended or adjusted under 35 U.S.C. 154(b) by 340 days.

(21) Appl. No.: 15/783,194

(22) Filed: Oct. 13, 2017

(65) Prior Publication Data

US 2019/0113548 A1 Apr. 18, 2019

(51) Int. Cl.
   *G01R 19/15* (2006.01)
   *G01R 1/20* (2006.01)
   *G01R 15/18* (2006.01)

(52) U.S. Cl.
   CPC .............. *G01R 19/15* (2013.01); *G01R 1/20* (2013.01); *G01R 15/181* (2013.01)

(58) Field of Classification Search
   CPC ..... G01R 19/14; G01R 29/0892; G01R 31/06
   See application file for complete search history.

(56) References Cited

U.S. PATENT DOCUMENTS

| | | | |
|---|---|---|---|
| 7,741,835 B2* | 6/2010 | Tan | G01R 1/06788 324/755.01 |
| 2005/0073428 A1* | 4/2005 | Sugimoto | G01R 15/04 340/815.45 |
| 2019/0201085 A1* | 7/2019 | Shelton, IV | A61B 17/320068 |

* cited by examiner

*Primary Examiner* — Tung X Nguyen
(74) *Attorney, Agent, or Firm* — Che-Yang Chen; Law Offices of Scott Warmuth

(57) ABSTRACT

An electric power measuring device, consisting of a casing, which is provided with a first end, a second end, and a first through hole; a detection circuit board, which is mounted within the casing, and a switch and an indicator light set are mounted on the detection circuit board; an input pin set, which is mounted on the circuit board, moreover, a contact end of the input pin set passes through the area at the first end and is exposed external of the casing; an output pin set, which is contained within the casing and positioned at the second end; and a coil, which is mounted within the casing and encircles the first through hole. In addition, two ends of the coil are respectively connected to any one of the pins of the input pin set and any one of the pins of the output pin set.

10 Claims, 4 Drawing Sheets

ELECTRIC POWER MEASURING DEVICE

BACKGROUND OF THE INVENTION

(a) Field of the Invention

The present invention relates specifically to an electric power measuring device.

(b) Description of the Prior Art

One end of current plug socket detectors is an input pin set, while the other end is an indicator light set. The input pin set is used to insert into a complete plug socket. The user can be informed whether the supple wire (commonly referred to as the live wire) and the neutral wire are wrongly connected or not according to the directives of the indicator light set One end of current electric current detectors is an input pin set, while the other end is an output pin set, and a coil is installed in the middle portion that functions as a current clamp meter for clamping round. Accordingly, when the user clamps the current clamp meter around a wire coil, then the current clamp meter can be used to find out the electric current value.

The aforementioned plug socket detectors and electric current detectors are all extremely common devices used in an electrician's field of work. However, at a time when a user does not have a tool that integrates the above two functions, then the user needs to carry two detectors for their work to accommodate different needs, which, apart from the inconvenience of having to carry two detectors, there is also the problem of a rise in cost resulting from requiring two detectors.

Hence, it is the strong desire of the inventor of present invention and manufacturers engaged in related art, and purpose of the present invention to research, improve, and resolve the problems and shortcomings of the aforementioned prior art.

SUMMARY OF THE INVENTION

In order to improve the aforementioned problems, a primary object of the present invention lies in providing an electric power measuring device that integrates the functions of a plug socket detector and an electric current detector.

In order to achieve the aforementioned object, the electric power measuring device provided by the present invention comprises: a casing, which is provided with a first end, a second end, and a first through hole; a detection circuit board, which is mounted within the casing, with a switch and an indicator light set mounted on the detection circuit board; an input pin set, which is mounted on the circuit board, moreover, a contact end of the input pin set passes through the area at the first end and is exposed external of the casing; an output pin set, which is contained within the casing and positioned at the second end; and a coil, which is mounted within the casing and encircles the first through hole, moreover, two ends of the coil are respectively connected to any one of the pins of the input pin set and any one of the pins of the output pin set.

In an embodiment, the casing comprises an upper casing member and a lower casing member, with the upper casing member and the lower casing member juxtaposed assembled to enclose a holding space.

In the embodiment, transparent light cover modules are mounted on the upper casing member and the lower casing member corresponding to the area of the indicator light set.

In the embodiment, the input pin set is provided with a first input pin, a second input pin and a third input pin. The first input pin and the second input pin are connected to one side of the detection circuit board, and the third input pin is connected to the other side of the detection circuit board.

In the embodiment, the output pin set is provided with a first output pin and a second output pin. A first wire end of the aforementioned coil is connected to the first output pin, and a second wire end of the coil is connected to the first input pin.

In the embodiment, the first through hole is provided between the first end and the second end.

In an embodiment, the casing is provided with a second through hole,

In the embodiment, the first through hole and the second through hole are provided between the first end and the second end.

In the embodiment, the first through hole and the second through hole are provided side by side.

In the embodiment, an information display portion is further installed on the exterior surface of the casing.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

In the following embodiments of the present invention, symbols of the same or similar components represent the same or similar components. Moreover, direction phraseology referred to in the embodiments disclosed below, such as: upper, lower, left, right, front, or rear, are only in reference to the appended drawings, hence, the direction phraseology used is intended to illustrate and is not intended to limit the present invention.

Figure 1:
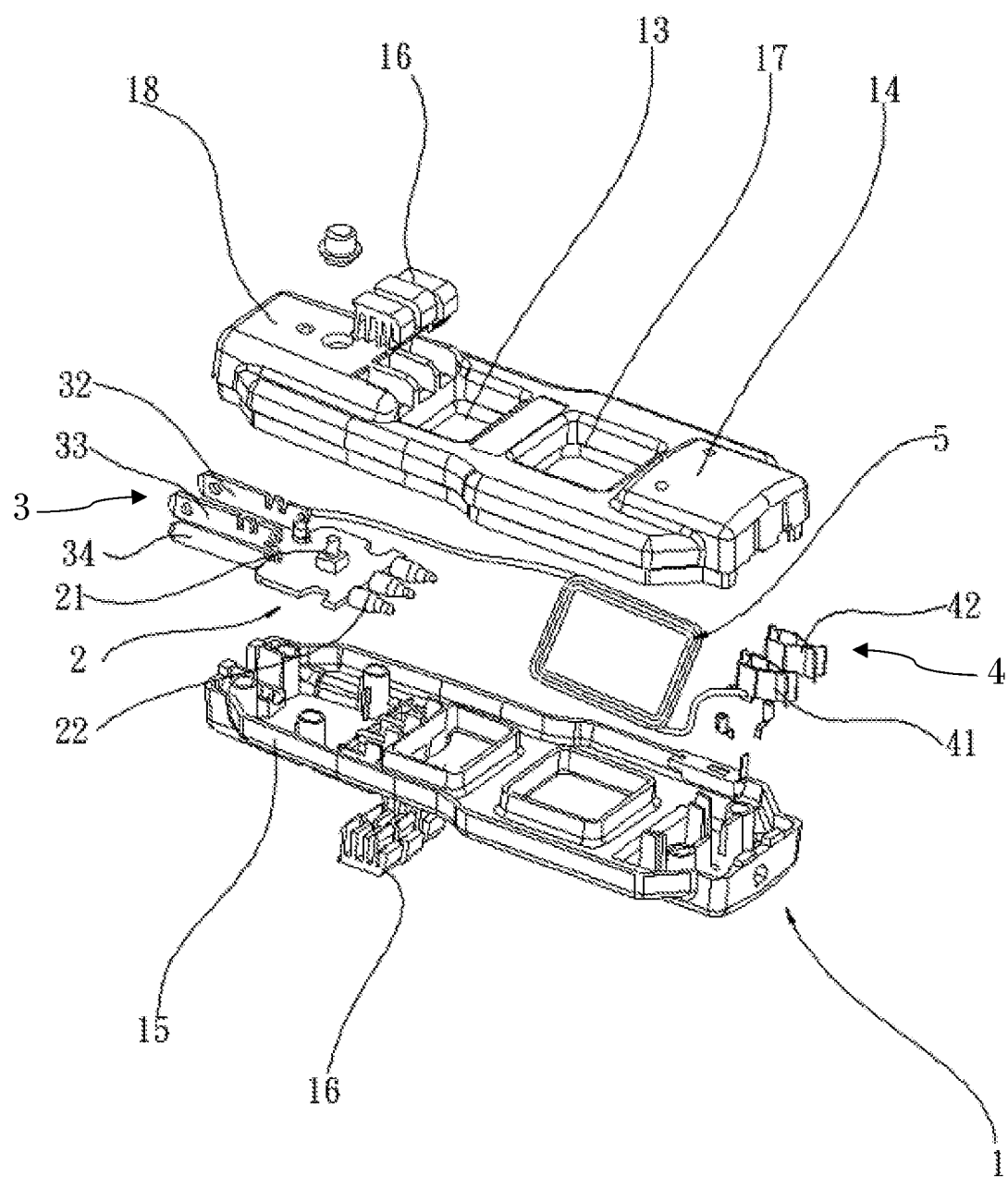
FIG. 1 is an exploded schematic view of a first embodiment of the present invention.
Figure 2:
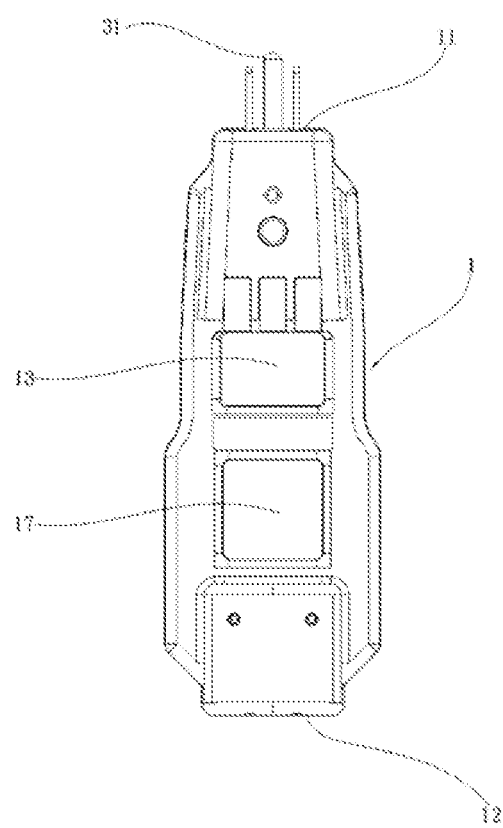
FIG. 2 is a top schematic view of the first embodiment of the present invention.
Figure 3:
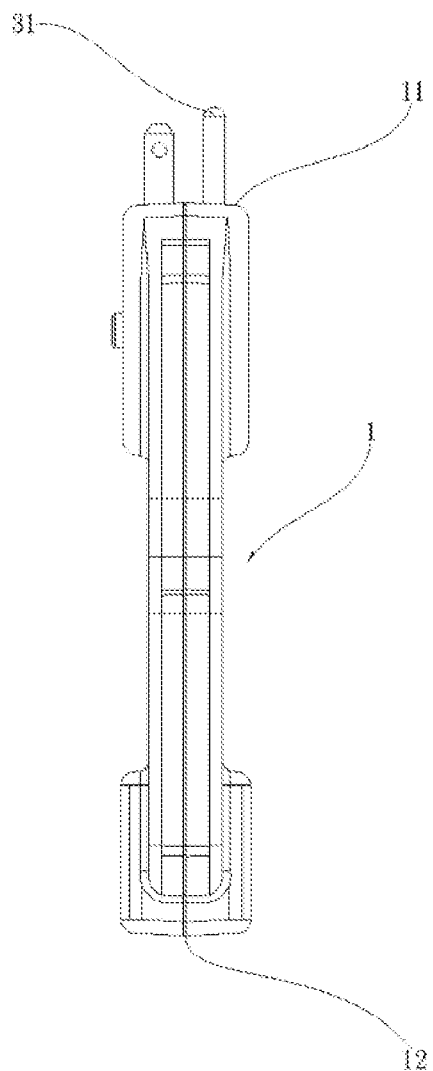
FIG. 3 is a side schematic view of the first embodiment of the present invention.

Referring to FIG. 1, FIG. 2, and FIG. 3, which show an exploded schematic view, a top schematic view, and a side schematic view of a first embodiment of the present invention, respectively. A front end and a rear end of a casing 1 of the present invention are represented by a first end 11 and a second end 12, respectively, and a first through hole 13 and a second through hole 17 are provided between the first and second ends 11, 12. Transparent light cover modules 16 are further provided on the aforementioned casing 1. The casing 1 is formed from a juxtaposition assembly of an upper casing member 14 and a lower casing member 15. A side area of the upper casing member 14 is provided with an information display portion 18, and the information display portion 18 can be a light signal display gauge that enables a user to interpret or is a quick-response code that connects to a corresponding webpage through a smart phone to obtain information.

A detection circuit board 2 is disposed inside the casing 1, and a switch 21, and an indicator light set 22, an upper switch cover 23, and a short circuit test indicator light 24 are mounted on the detection circuit board 2. Electronic parts (not shown in the drawings) are mounted on the detection circuit board 2, with the electronic parts being used to detect whether or not the supply wire (commonly referred to as the live wire) and the neutral wire of a plug socket are correct. Accordingly, the test results, through the change in the light of the indicator light set 22 going out in correlation with the display on the information display portion 18, will enable the user to be informed of the current condition of the test plug socket. The upper switch cover 23 corresponds to the top of the switch 21 to convenience the user to press and operate the device.

An input pin set 3 comprises a first input pin 32, a second input pin 33, and a third input pin 34. The drawings depicted in the present embodiment show a plug socket configuration conforming to U.S. regulations, which can be replaced with socket configurations of other countries according to different usage areas and different needs. The first and second input pins 32, 33 are connected to one side of the detection circuit board 2, while the third input pin 34 is connected to the other side of the detection circuit board 2. When the casing 1 is assembled, the exposed external portion of the input pin set 3 is defined as a contact end 31, which is used to insert into a plug socket for use thereof.

An output pin set 4 comprises a first output pin 41 and a second output pin 42, which enable plug sockets of other electric appliances to connect thereto and for use thereof. Moreover, the number and specifications of the output pin set 4 can be subjectively replaced according to usage areas and needs.

A coil 5 is connected between the aforementioned first output pin 41 and first input pin 32. The coil 5 encircles any one or both of the first through hole 13 and the second through hole 17, however, the number of encircling turns of the coil 5 is different, the object of which lies in providing a function to measure current value using one of the clamp windings of either the first through hole 13 or the second through hole 17 as a current clamp meter. The number of encircling turns of the coil 5 can be changed according to needs, wherein the larger the number of coil turns the greater the multiplying factor.

Apart from the aforementioned testing of electric current, the present invention is also used as a ground fault circuit interrupter (abbreviated to GFCI). A large number of current ground fault circuit interrupters are used on various types of electrical installations. Using North America as an example, every household must install 5 GFCI plug sockets, including the rooms with high humidity, such as the bathroom, the Kitchen, etc., and where electric appliances are relatively concentrated, as well as places where electrical leakage and malfunctions easily occur. Hence, whether the GFCIs are operating normally is extremely important for safety reasons. When plugged into a GFCI plug socket and the switch 21 pressed, the electric power measuring device of the present invention can immediately test whether the GFCI is operating normally or not. Accordingly, if the GFCI is operating normally, then the reset button of the GFCI should spring up and execute a disconnection operation. On the contrary. if the reset button does not spring up, this indicates that the GFCI is abnormal, and maintenance repairs need to be carried out. When the switch 21 of the electric power measuring device of the present invention is pressed, the short circuit test indicator light 24 will immediately light up, indicating that the test function is operating normally, if the short circuit test indicator light 24 does not light up when the switch 21 is pressed, then it indicates that the test function is abnormal and maintenance repairs need to be carried out.

Figure 4:
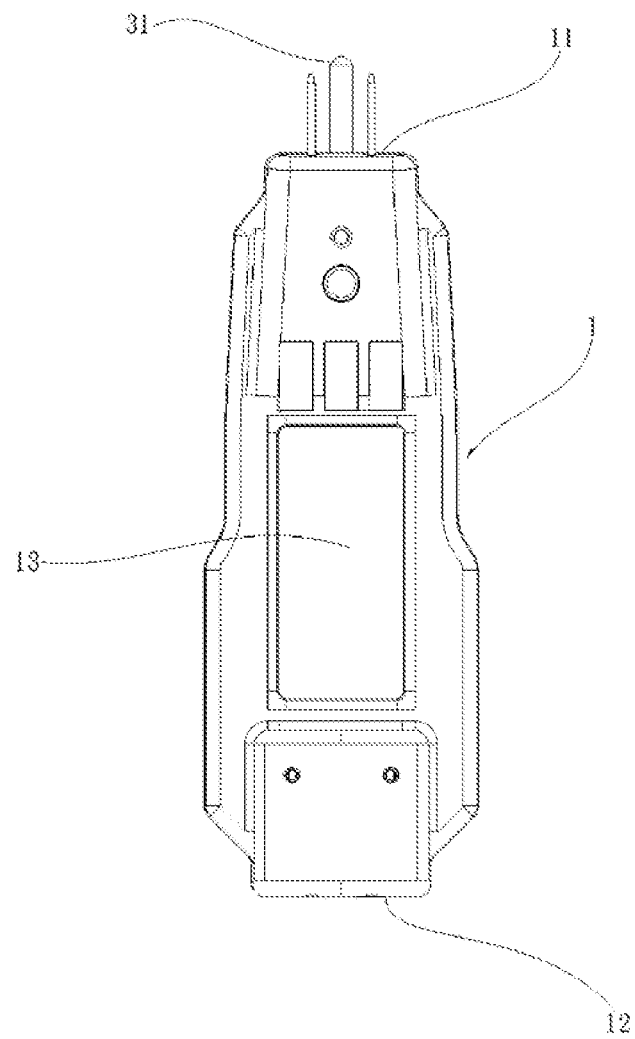
FIG. 4 is a top schematic view of a second embodiment of the present invention.

Referring to FIG. 4, which shows a top schematic view of a second embodiment of the present invention, wherein a portion of the described structure thereof is identical to that of the first embodiment, and thus not further detailed herein. The most important difference between the second embodiment and the first embodiment of the present invention is only in the first through hole 13, which is provided with an opening that has a relatively larger area, making it more convenient for the current clamp meter to clamp round. Moreover, the shape of the first through hole 13 can also be subjectively changed according to user needs, such as, making the through hole 13 round shaped, and the like.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. An electric power measuring device, comprising:
   a casing, the casing is provided with a first end, a second end, and a first through hole;
   a detection circuit board, the detection circuit board is mounted within the casing, the detection circuit board is further provided with a switch and an indicator light set;
   an input pin set, the input pin set is mounted on the circuit board, and a contact end of the input pin set passes through the area at the first end and is exposed external of the casing;
   an output pin set, the output pin set is contained within the casing and positioned at the second end; and
   a coil, the coil is mounted within the casing and encircles the first through hole; moreover, the two ends of the coil respectively connect to any one of the pins of the input pin set and any one of the pins of the output pin set.

2. The electric power measuring device according to claim 1, wherein the casing comprises an upper casing member and a lower casing member, the casing is formed from a juxtaposition assembly of the upper casing member and the lower casing member that enclose a holding space.

3. The electric power measuring device according to claim 2, wherein transparent light cover modules are mounted on the upper casing member and the lower casing member corresponding to the area of the indicator light set.

4. The electric power measuring device according to claim 1, wherein the input pin set is provided with a first input pin, a second input pin, and a third input pin; the first input pin and the second input pin are connected to one side of the detection circuit board, and the third input pin is connected to the other side of the detection circuit board.

5. The electric power measuring device according to claim 4, wherein the output pin set is provided with a first output pin and a second output pin; a first wire end of the coil is connected to the first output pin, and a second wire end of the coil is connected to the first input pin.

6. The electric power measuring device according to claim 1, wherein the first through hole is provided between the first end and the second end.

7. The electric power measuring device according to claim 1, wherein the casing is provided with a second through hole.

8. The electric power measuring device according to claim 7, wherein the first through hole and the second through hole are provided between the first end and the second end.

9. The electric power measuring device according to claim 7, wherein the first through hole and the second through hole are provided side by side.

10. The electric power measuring device according to claim 1, wherein an information display portion is further provided on the exterior surface of the casing.

* * * * *